United States Patent [19]

Getson

[11] Patent Number: 4,862,827
[45] Date of Patent: Sep. 5, 1989

[54] APPARATUS FOR COATING SEMICONDUCTOR COMPONENTS ON A DIELECTRIC FILM

[75] Inventor: John C. Getson, Adrian, Mich.

[73] Assignee: Wacker-Chemie GmbH, Munich, Fed. Rep. of Germany

[21] Appl. No.: 212,645

[22] Filed: Jun. 28, 1988

[51] Int. Cl.$^4$ .............. B05C 5/02; H05K 3/12; H05K 3/22

[52] U.S. Cl. .................. 118/620; 118/58; 118/209; 118/314; 118/324; 118/642

[58] Field of Search ............... 29/827; 269/903; 118/620, 629, 630, 641, 642, 500, 50.1, 50, 629, 21, 209, 314, 324, 58

[56] References Cited

U.S. PATENT DOCUMENTS

| | | | |
|---|---|---|---|
| 613,756 | 11/1898 | Buddle | 474/141 |
| 1,963,314 | 4/1933 | Savell et al. | 198/158 |
| 3,738,315 | 6/1973 | Sweitzer | 118/500 |
| 3,991,710 | 11/1976 | Gourdine et al. | 118/630 |
| 4,219,926 | 9/1980 | Bloch et al. | 29/832 |
| 4,265,954 | 5/1981 | Romanek | 428/85 |
| 4,343,083 | 8/1982 | Takemura et al. | 29/832 |
| 4,397,074 | 8/1983 | Thornton et al. | 29/564 |
| 4,411,982 | 10/1983 | Shibuya et al. | 430/314 |
| 4,419,803 | 12/1983 | Thornton et al. | 29/428 |
| 4,438,723 | 3/1984 | Cannella et al. | 118/58.1 |
| 4,441,245 | 4/1984 | Thornton et al. | 29/564 |
| 4,465,543 | 8/1984 | Sadamasa et al. | 156/542 |
| 4,606,117 | 8/1986 | Takahashi et al. | 29/740 |
| 4,611,554 | 9/1986 | Mahlkow et al. | 118/316 |
| 4,636,405 | 1/1987 | Mensah et al. | 118/641 |
| 4,644,899 | 2/1987 | Glaus | 118/642 |
| 4,763,409 | 8/1988 | Takekawa et al. | 29/827 |

FOREIGN PATENT DOCUMENTS 0051433 4/1980 Japan .................. 118/641

Primary Examiner—Willard Hoag

[57] ABSTRACT

Apparatus for applying a coating to semiconductor chips mounted within apertures in a dielectric film. The film containing the semiconductor chips and input-output connectors is fed from a reel past an applicator for applying the coating on one side of the chips. After passing through a curing chamber, the film passes about a substantially square sprocket so as to reverse the direction of travel. The sprocket is of such a dimension that the film bends on a line between each individual chip or a selected group of chips. The strip then passes by another applicator for coating the other side of the chips. After passing through the curing chamber, including a substantially square sprocket, the film is wound on a driven sprocket. The coating may be a silicone composition, an epoxy resin, or a urethane composition.

9 Claims, 2 Drawing Sheets

APPARATUS FOR COATING SEMICONDUCTOR COMPONENTS ON A DIELECTRIC FILM

This invention relates generally to coating of articles and, more specifically, to the coating of semiconductor components which are secured within an aperture in a dielectric film.

It is common practice to secure semiconductor chips and their input-output connectors on a dielectric film. This type of process permits the manufacture of specific components on a continuously moving film with each individual component being secured for subsequent attachment to a substrate such as a circuit board.

One problem with manufacturing and using this type of semiconductor component is that it is very susceptible to various contaminants such as dirt and moisture, particularly if it is stored for a considerable period of time. Additionally, the components are subject to various contaminants and moisture when the film is cut, and damage may result due to contact with each other. To avoid this problem coatings have been applied to cover the components on the dielectric strip.

In certain applications it is desirable to support a chip above an aperture in the film. The chip is supported by compression-bonding the ends of the lead wire to the inner periphery of the aperture in the film. In such practice the protective coating discussed above is applied to only one side of the chip. This leaves the opposite side of the chip unprotected.

A further problem exists if the chips are to be stored or shipped prior to being mounted on a printed circuit board. Damage to the individual components would be greatly reduced if the cutting of the film occurred at the location where the component is mounted on a circuit board.

Accordingly, it is an object of this invention to provide a method and apparatus for coating semiconductor components mounted in apertures in a dielectric film.

It is an additional object of this invention to provide means for handling the film while applying the coating and subsequent curing of the coating without damaging the particular components or the electrical leads associated therewith.

A further object of this invention is to provide apparatus for coating semiconductor components on a flexible film wherein the size of the apparatus for providing such coating is substantially reduced.

These and other objects of the invention will become obvious from the following description taken together with the drawings.

BRIEF SUMMARY OF THE INVENTION

Apparatus is disclosed for applying a coating composition to semiconductor components such as silicon chips mounted in an aperture in a dielectric film. The film is passed from a storage reel beneath a spray applicator which applies the coating composition to the upper side of the chip. The film then passes into a curing chamber for curing and setting the composition. The film subsequently passes outwardly of the chamber and over a substantially square sprocket having standard prongs to mate with perforations in the film which reverses the direction of the film and leads it towards the curing chamber. Prior to entering the chamber, a second apparatus applies the coating composition on the other side of the chip. The film then returns to the curing chamber so that the second coating may be cured and set, and then passes over a further substantially square sprocket and is led outwardly from the curing chamber and stored on a reel. The sides of the substantially square sprocket are of a dimension such that the film bends only between the semiconductor components or a group of semiconductor components on the film.

DETAILED DESCRIPTION OF THE PREFERRED EMBODIMENT

Figure 1:
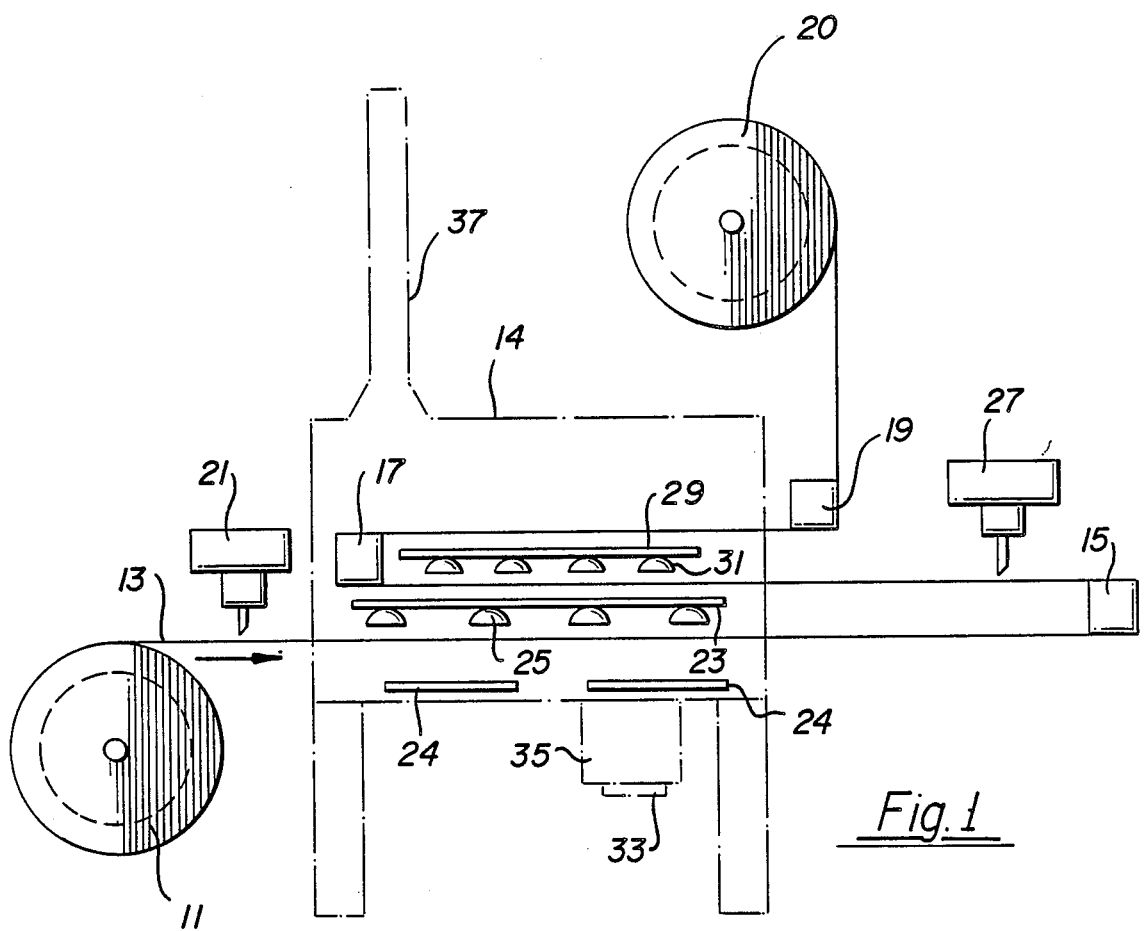
FIG. 1 is a schematic diagram showing the system using the apparatus of the present invention.

Referring to FIG. 1, there is shown a supply reel 11 which has wound thereon flexible film having semiconductor components such as silicone chips mounted above an aperture in the film and supported by input-output connectors connected to the interior edge of the aperture. Associated conductors are etched or printed on the film. There is a small spacing on the film between each of the components and their input-output connectors.

In order not to damage the components mounted on the film, supply reel 11 must have a substantial spindle diameter since any extreme bending of the components could damage them. Such a diameter is indicated by the interrupted lines.

Film 13 is shown passing from supply reel 11 past applicator 21. This is a standard type of micro-dot applicator which is used to apply the desired coating composition on the upper side of the chip mounted relative to film 13. The film then passes through curing chamber 14 so as to cure and set the coating composition applied to the chip by applicator 21, and passes outwardly of curing chamber 14 and over square sprocket 15 so as to reverse the direction of the film. As will be described more thoroughly as the description proceeds, the sides of the substantially square sprocket 15 are of a dimension such that the film is only bent transversely between each individual component or a series of components if the size warrants.

As the film travels back towards curing chamber 14, a second applicator 27 applies the coating composition on the opposite side of the chip. The film then reenters the curing oven 14 so as to cure and set the second application of coating composition and passes about square sprocket 17 so as to reverse direction and lead it outwardly from the curing chamber 14. In the specific illustration shown, the film passes over two, sides of sprocket 19 and is then wound on take-up reel 26. Take-up reel 26 is power-driven so as to supply the necessary movement of the film. In some cases it may be desirable to drive square sprockets 15, 17, and 19. If so, the rotation of these sprockets must be coordinated with the rotational speed of take-up reel 20.

Depending upon the composition, several different methods of curing may be used. All of the methods used are designed to accelerate the curing so that this may be a continuous operation from the supply reel to the take-up reel.

Standard heaters 24 may be used to control the inside heat of the curing chamber 14. These may be electrical, gas, etc. If sufficient heat is provided by lamps, such lamps 25, mounted on frame 23, and lamps 31, mounted on frame 29, may also be used. These lamps may be ultraviolet lamps or infrared lamps for supplying the necessary heat.

Figure 2:
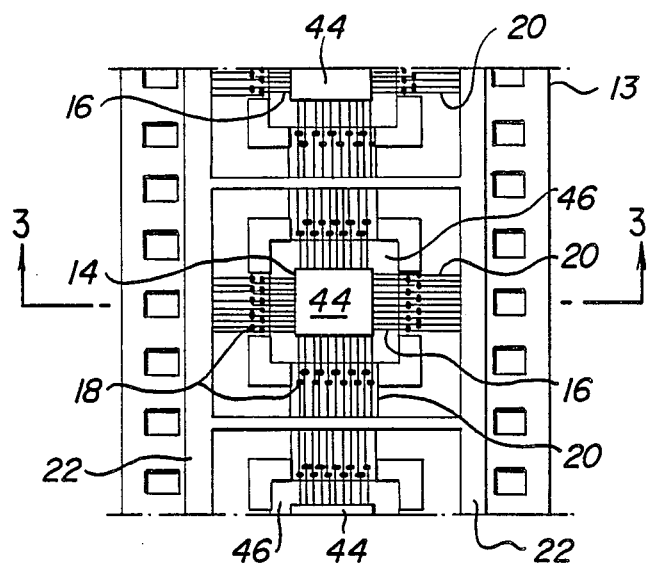
FIG. 2 is a plan view of a chip mounted relative to the dielectric film of FIG. 1.
Figure 3:
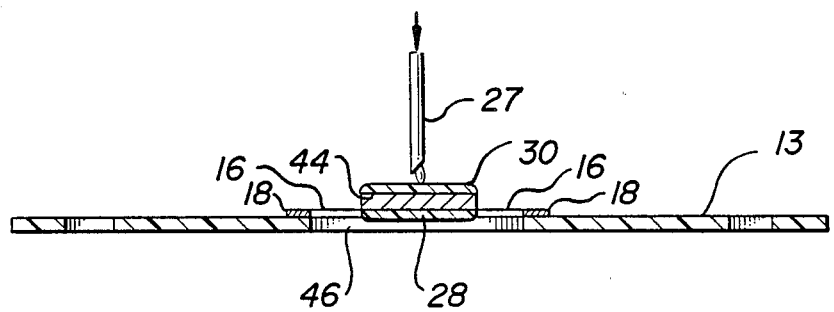
FIG. 3 is a view taken along the lines 3—3 of FIG. 2.

FIG. 2 is an enlarged schematic of a portion of the film of FIG. 1. Film 13 includes aperture 46 with chip 44 being supported above the aperture by a plurality of input-output connectors 16 which are secured to the inner periphery of aperture 46 by conductive bonding material 18 (FIG. 3). Leads 20 are etched or coated on film 13 so as to interconnect chip 44 with conductive strips 22. This construction is known in the art. The schematic illustration of FIG. 3 shows chip 44 after coating 28 has been cured in chamber 14 and coating 30 has just been applied by applicator 27 such as a micro-dot applicator. As can be seen, both major faces of chip 44 have been coated.

Some compositions are radiation curable and, in such cases, ultraviolet lamps may be used. In still other possible curing applications an electron beam may be used.

Referring to FIG. 1, there is shown air intake 33 and exhaust 37, with chamber 35 downstream of the air path from air intake 33. This chamber may be used for introducing carbon dioxide for accelerating and curing certain compositions and/or it may be used for introducing additional moisture to further accelerate curing of moisture-curable systems.

Figure 4:
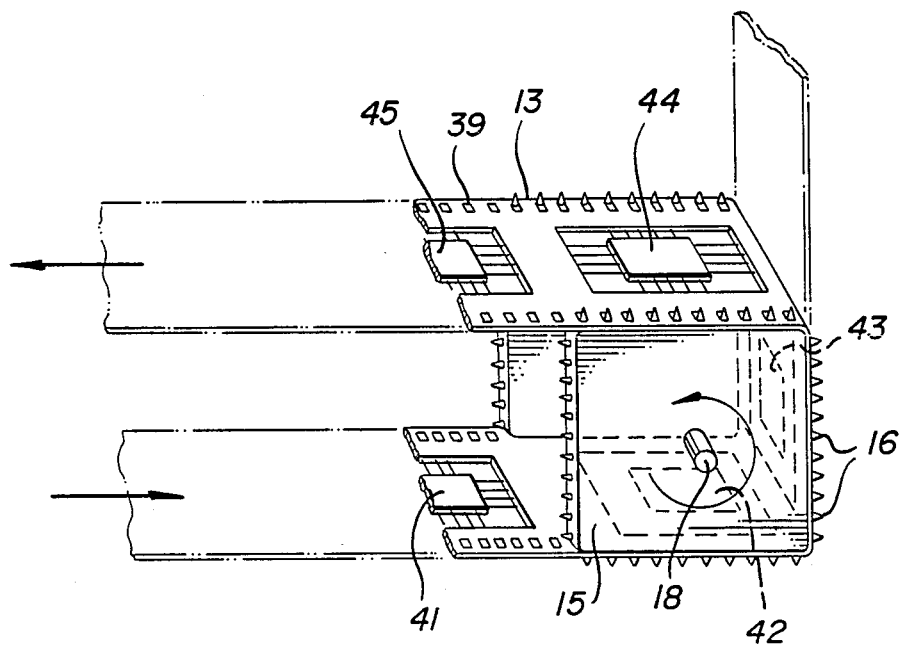
FIG. 4 is a perspective view of one of the substantially square sprockets used in the present invention.

FIG. 4 is a detailed perspective view of a substantially square sprocket such as sprocket 15. Sprocket 15 has standard teeth 12 which mate with perforations 39 on the edges of the film. Semiconductor components 41, 42, 43, 44, and 45 are shown as they are passing about sprocket 15, which rotates in the direction of the arrow. As stated above, the length of the sides of the sprocket are coordinated with the spacing of the semiconductor components on the film so that bending of the film occurs only on a line between the components where there are no wires or parts of the components.

As will be obvious, the use of these substantially square sprockets tremendously reduces the size of the apparatus necessary to accomplish the curing. If standard reels were used, they would have to be of a very large size (such as the supply and take-up reels) in order to avoid damage to the semiconductor components. Further, no matter how large the reels are within practical reasons, there is still a danger of damaging the coatings while they are in the process of being cured. This possibility is entirely eliminated through the use of the substantially square sprockets.

The coating composition which may b used to coat the electrical chips may be curable silicone compositions, an epoxy resin, or a urethane composition.

The curable silicone compositions consist of crosslinkable organopolysiloxanes or modified organopolysiloxanes, a crosslinking agent and a catalyst, if desired.

The organopolysiloxanes employed in the curable coating composition may be a diorganopolysiloxane having the general formula $$R^1(SiR_2O)_xSiR_2R$$

in which R represents the same or different monovalent hydrocarbon radicals having from 1 to 18 carbon atoms, $R^1$ 1 represents condensable groups, hydrolyzable groups, monovalent hydrocarbon radicals and monovalent hydrocarbon radicals having aliphatic unsaturation and x is a number greater than 10.

Other organopolysiloxanes which may be employed are organopolysiloxanes having organic polymers which are linked by chemical bonding to organopolysiloxanes, including diorganopolysiloxanes, and which represent graft polymers or block copolymers or those formed in the presence of organopolysiloxanes by the polymerization of at least one organic compound having at least one aliphatic carbon-carbon double bond.

A two-component room temperature vulcanizable organopolysiloxane composition may be employed in which hydroxyl-terminated diorganopolysiloxanes are crosslinked by the addition of polyalkoxysilanes of the formula $$(R^3O)_nSiR_{4-n}^2$$

or polyalkoxysiloxanes in which the silicon atoms are linked through $\equiv$Si—O—Si$\equiv$ linkages and the remaining valences of the silicon atoms are satisfied by $R^2$ and $R^3O$ radicals and catalysts. In the above formula, $R^2$ is a monovalent hydrocarbon radical or a halogenated monovalent hydrocarbon radical having from 1 to 10 carbon atoms, $R^3$ is a monovalent hydrocarbon radical having from 1 to 10 carbon atoms, and n is 3 or 4.

Heat-curable organopolysiloxanes which are crosslinked in the presence of peroxides may also be employed in this invention. Preferably, an electron beam is employed as a heat source to produce curing. The organopolysiloxanes are preferably diorganopolysiloxanes having the following formula $$R^1(SiR_2O)_xSiR_2R^1$$

where R and x are the same as above and $R^1$ is a monovalent hydrocarbon radical or a radical having aliphatic unsaturation.

When the organopolysiloxane compositions are crosslinked by the addition of Si-bonded hydrogen to an aliphatically unsaturated carbon-to-carbon group, the diorganopolysiloxane may be represented by the formula $$R^1(SiR_2O)_xSiR_2R^1$$

where R and x are the same as above and $R^1$ is an aliphatically unsaturated radical.

Organohydrogenpolysiloxanes employed as crosslinking agents in the compositions of this invention generally consist of units of the general formula $$R_m^4SiO_{(4-m/2)}$$

where $R^4$ represents hydrogen, a monovalent hydrocarbon radical or a halogenated monovalent hydrocarbon radical having from 1 to 18 carbon atoms, in which at least two and preferably three Si-bonded hydrogen atoms are present per molecule, and m is 1, 2 or 3.

Platinum catalysts, which are employed in these compositions, may consist of finely dispersed platinum as well as platinum compounds and/or platinum complexes which have been used heretofore to promote the addition of Si-bonded hydrogen atoms to compounds having aliphatically unsaturated groups.

Radiation curable silicone compositions may be used in the present invention for coating electrical chips. Ultraviolet radiation is one of the most widely used types of radiation because of its low cost and shorter cure times. In addition, heat-sensitive materials can be safely coated and cured with ultraviolet radiation because of the relatively low temperatures involved.

Basic UV-curable silicone systems have been developed which utilize, for example, epoxysilicones, acrylic functional silicones and mercaptofunctional silicones.

Radiation polymerizable compositions containing organopolysiloxanes having an average of at least one nitrogen-containing group per molecule linked to a silicon atom through an Si—N or Si—O—N linkage and a photo-induced free radical source may be used in this invention for coating the semiconductor components. These radiation polymerizable compositions are described in U.S. Pat. No. 4,526,955 to Bennington et al.

Epoxysilicones such as those disclosed in U.S. Pat. Nos. 4,279,717 and 4,576,999 describe epoxy-functional diorganosiloxane based polymers catalyzed by onium salt photoinitiators. These compositions exhibit extremely high cure rates. Acrylic-functional silicones such as disclosed in U.S. Pat. Nos. 4,348,454, 4,048,036, and 4,017,652 describe coatings that are UV-curable in the presence of free radical-type photoinitiators.

Urethane compositions which may be used to form a curable coating on the electrical chips are obtained by reacting an organic polyisocyanate with a compound having at least two groups bearing a Zerewitinoff-active hydrogen atom. General discussions of typical reactions of organic isocyanates and compounds having active hydrogen atoms are presented in the following review articles: Chem. Rev. 43, pp. 207–211 (1948); Chemistry of Organic Isocyanates, HR-2, Elastomers Division, E. I. du Pont de Nemours and Co., Inc., Wilmington 98, Delaware; Chem. Rev. 57, pp. 47–76 (1957). In general, these hydrogen atoms are attached to carbon, oxygen, nitrogen or sulfur atoms.

Epoxy resins which may be used to form a curable coating for the electrical chips in the present invention are well known in the art. The most widely used epoxy resins are those obtained from the reaction of epichlorohydrin with bisphenol A(4,4′=isopropylidenediphenol). Other polyols such as aliphatic glycols and novolak resins can be used instead of the bisphenol.

Other types of epoxy resins which may be employed to form curable coatings are those obtained from the epoxidation, with peroxy compounds, of double bonds in certain Diels-Alder adducts.

As will be evident, the present apparatus provides an efficient and compact method of applying coatings to components supported on flexible dielectric film.

Figure 5:
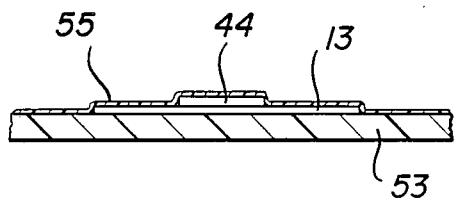
FIG. 5 is a partial sectional view of a chip and dielectric film mounted on a circuit board and covered by a conformal coating.

Referring to FIG. 5, after the coated semiconductors have been coated in accordance with the method of this invention, they may be mounted on printed circuit boards and a conformal coating 55 is applied thereto so as to cover the printed circuit board, silicon chip and all input-output connectors. Any coating composition which is compatible with the coating and the semiconductor components may be used as a conformal coating. When the coating on the semiconductor components is a silicone composition, then it is preferred that the conformal coating be a silicone composition. Often, the silicone composition used as a conformal coating may cure into the surface of the silicone coating on the semiconductor to form an integral coating. The silicone coatings described heretofore may be employed as conformal coatings for the printed circuit board.

The above description and drawings are illustrative, only, since modifications could be made without departing from the invention, the scope of which is to be limited only by the following claims.

I claim:

1. Apparatus for coating semiconductor components to provide protection against moisture, various contaminants, and mechanical abrasion comprising
   an elongated film having perforations adjacent the edges thereof;
   a plurality of apertures along said film;
   semiconductor components mounted within said apertures;
   first means for applying a curable compound to one side of said components;
   a curing chamber;
   means for passing said film through said curing chamber for curing said compound;
   second means for applying a curable compound to the other side of said component;
   means for repassing said film through said curing chamber for curing said second applied compound; and
   means for storing said film.

2. The apparatus of claim 1 further comprising
   a plurality of ultraviolet lamps within said curing chamber.

3. The apparatus of claim 1 further comprising
   means for introducing carbon dioxide into said curing chamber.

4. The apparatus of claim 1 further comprising
   means for introducing moisture into said curing chamber.

5. The apparatus of claim 1 wherein said coating is silicone.

6. The apparatus of claim 1 further comprising
   input-output connectors secured between said semiconductor component and the inner periphery of said aperture;
   a first substantially square sprocket over which said film passes after it first leaves said curing chamber so as to reverse the direction of travel of said film;
   said sprocket having sides of a dimension so that said film bends on a transverse line between said components;
   a second substantially square sprocket within said curing chamber about which said film passes after it is repassed into said curing chamber; and
   wherein said means for storing said film comprises a driven take-up reel for winding said strip as it passes outwardly of said curing chamber.

7. The apparatus of claim 1 further comprising
   heating means within said curing chamber.

8. The apparatus of claim 7 wherein said heating means comprises a plurality of ultraviolet lamps.

9. The apparatus of claim 7 wherein said heating means comprises a plurality of infrared lamps.

* * * * *

UNITED STATES PATENT AND TRADEMARK OFFICE
CERTIFICATE OF CORRECTION

PATENT NO. : 4,862,827
DATED : September 5, 1989
INVENTOR(S) : John C. Getson

It is certified that error appears in the above-identified patent and that said Letters Patent is hereby corrected as shown below:

Title page, item [73]: under "Assignee:",
    insert---Wacker Silicones Corporation
           Adrian, Michigan ---, and delete "Wacker-Chemie GmbH, Munich,
        Fed. Rep. of Germany".

Signed and Sealed this

Seventh Day of August, 1990

*Attest:*

HARRY F. MANBECK, JR.

*Attesting Officer*      *Commissioner of Patents and Trademarks*